United States Patent
Cho et al.

(10) Patent No.: US 9,391,233 B2
(45) Date of Patent: Jul. 12, 2016

(54) METHOD FOR MANUFACTURING LIGHT EMITTING DEVICE PACKAGE

(71) Applicant: SAMSUNG ELECTRONICS CO., LTD., Suwon-si, Gyeonggi-do (KR)

(72) Inventors: Myong-soo Cho, Yongin-si (KR); Myeong-rak Son, Suwon-si (KR); Young-chul Shin, Yongin-si (KR); Seung-hwan Lee, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 80 days.

(21) Appl. No.: 14/163,587

(22) Filed: Jan. 24, 2014

(65) Prior Publication Data

US 2014/0213002 A1    Jul. 31, 2014

(30) Foreign Application Priority Data

Jan. 25, 2013    (KR) .................. 10-2013-0008633

(51) Int. Cl.
*H01L 21/00* (2006.01)
*H01L 33/00* (2010.01)

(52) U.S. Cl.
CPC ......... *H01L 33/0079* (2013.01); *H01L 33/0095* (2013.01); *H01L 2933/0033* (2013.01)

(58) Field of Classification Search
None
See application file for complete search history.

(56) References Cited

U.S. PATENT DOCUMENTS

| 7,488,621 B2 | 2/2009 | Epler et al. |
| 7,977,686 B2 | 7/2011 | Ibbetson et al. |
| 8,227,271 B1 | 7/2012 | Ho |
| 2006/0091409 A1* | 5/2006 | Epler .................. H01L 33/0079 257/95 |
| 2013/0130440 A1* | 5/2013 | Hu .......................... H01L 24/83 438/107 |

FOREIGN PATENT DOCUMENTS

| JP | 2010157679 A | 7/2010 |
| KR | 1020060020605 A | 3/2006 |
| KR | 1020110047781 A | 5/2011 |
| KR | 1020110076610 A | 7/2011 |
| KR | 101128261 B1 | 3/2012 |

* cited by examiner

*Primary Examiner* — Calvin Choi
(74) *Attorney, Agent, or Firm* — Muir Patent Law, PLLC

(57) ABSTRACT

A method for manufacturing a light emitting device package is provided. In the method, a growth substrate including a plurality of light emitting devices disposed on a top surface of the growth substrate is prepared. A first package substrate having a bonding pattern corresponding to a portion of the plurality of light emitting devices is prepared, and the bonding pattern is disposed on a top surface of the first package substrate. The portion of the plurality of light emitting devices and the bonding pattern are bonded by disposing the top surface of the growth substrate to face the top surface of the first package substrate. The portion of the plurality of light emitting devices is separated from the growth substrate. The portion of the plurality of light emitting devices joined to the bonding pattern is packaged.

8 Claims, 18 Drawing Sheets

METHOD FOR MANUFACTURING LIGHT EMITTING DEVICE PACKAGE

CROSS-REFERENCE TO RELATED APPLICATION

This application claims the benefit of Korean Patent Application No. 10-2013-0008633, filed on Jan. 25, 2013, in the Korean Intellectual Property Office, the disclosure of which is incorporated herein in its entirety by reference.

TECHNICAL FIELD

The inventive concept relates to a method for manufacturing a light emitting device package, and more particularly, to a method for manufacturing a light emitting device package, which is simple in its process, and can be manufactured in a chip scale package at a wafer level.

BACKGROUND

A Light Emitting Diode (LED) is a light emitting device that changes electrical signals into light through a PN junction of compound semiconductors. Since LEDs can be damaged by external physical or chemical shocks, LEDS are implemented in a package to be used in various fields such as indoor/outdoor illumination, vehicle headlights, Back-Light Units (BLU), and medical appliances. Recently, a process of manufacturing a light emitting device package has become more complicated and difficult due to demands for high output and high efficiency of light emitting device packages.

SUMMARY

The disclosure provides a method for manufacturing a light emitting device package, which enables yield improvement and process automation.

According to an aspect of the disclosure, a method of manufacturing a light emitting device package is provided. The method includes preparing a growth substrate including a plurality of light emitting devices disposed on a top surface of the growth substrate, and preparing a first package substrate having a bonding pattern corresponding to a portion of the plurality of light emitting devices, the bonding pattern being formed on a top surface of the first package substrate. The portion of the plurality of light emitting devices and the bonding pattern are bonded by disposing the top surface of the growth substrate to face the top surface of the first package substrate. The portion of the plurality of light emitting devices are separated from the growth substrate, and the portion of the plurality of light emitting devices joined to the bonding pattern are packaged.

In certain other embodiments of the disclosure, the portion of the plurality of light emitting devices may be spaced apart from one another by at least one light emitting device.

In certain embodiments, the portion of the plurality of light emitting devices may be divided into groups including at least two light emitting devices that are adjacent to each other, and the groups may be spaced apart from one another by at least one group.

In certain embodiments, the bonding pattern may include a first conductive region and a second conductive region, and the bonding of the portion of the plurality of light emitting devices and the bonding pattern may include bonding the portion of the plurality of light emitting devices and the bonding pattern so that the portion of the plurality of light emitting devices overlap at least a portion of the first conductive region and the second conductive region.

In certain embodiments, the separating of the portion of the plurality of light emitting devices may include selectively performing a laser lift-off on the portion of the plurality of light emitting devices.

In certain embodiments, the packaging of the portion of the plurality of light emitting devices may further include: forming, over the first package substrate and lens units surrounding the portion of the plurality of light emitting devices, respectively; and cutting the first package substrate to form units from the portion of the plurality of light emitting devices, wherein each of the units includes one of the plurality of light emitting devices and one of the lens units.

In certain embodiments, the method may further include: preparing a second package substrate having a bonding pattern corresponding to a portion of the plurality of light emitting devices remaining in the growth substrate, formed on a top surface of the growth substrate; bonding the portion of the plurality of light emitting devices remaining on the growth substrate and the bonding pattern of the second package substrate by disposing the top surface of the growth substrate and a top surface of the second package substrate to face each other; and separating the portion of the plurality of light emitting devices bonded to the bonding pattern of the second package substrate from the growth substrate.

In certain embodiments, the first package substrate and the second package substrate may be separate from each other.

According to another aspect of the disclosure, there is provided a method of manufacturing a light emitting device package, including: preparing a growth substrate including a plurality of light emitting device groups disposed on a top surface of the growth substrate. A first package substrate is prepared having a first bonding pattern corresponding to first light emitting device groups that are not adjacent to one another among the plurality of light emitting device groups, the first bonding pattern being disposed on a top surface of the first package substrate. The first light emitting device groups and the first bonding pattern are bonded by disposing the top surface of the growth substrate to face the top surface of the first package substrate. The first light emitting device groups from the growth substrate are separated. A second package substrate is prepared having a second bonding pattern corresponding to second light emitting device groups that are not adjacent to one another among the plurality of light emitting device groups remaining in the growth substrate. The second bonding pattern being formed on a top surface of the growth substrate. The second light emitting device groups and the second bonding pattern are bonded by disposing the top surface of the growth substrate to face the top surface of the second package substrate, and the second light emitting device groups are separated from the growth substrate.

In certain embodiments of the disclosure, each of the plurality of light emitting device groups may include at least two light emitting devices that are adjacent to each other.

In certain embodiments, the plurality of light emitting device groups may be arranged to form a matrix shape on the top surface of the growth substrate.

In certain embodiments, the first light emitting device group and the second light emitting device group may be spaced apart from each other by at least one light emitting device group in row and column directions In certain embodiments, the plurality of light emitting device groups may be arranged to form a honeycomb shape on the top surface of the growth substrate.

In certain embodiments, the first light emitting device group and the second light emitting device group may be spaced apart from each other by at least one light emitting device group in row and diagonal directions.

In certain embodiments, the method may further include: forming lens units over the first package substrate for surrounding the light emitting devices of the first light emitting device group, forming the lens units over the second package substrate for surrounding the light emitting devices of the second light emitting device group. The first package substrate is cut to form units from the first light emitting device group, wherein each of the units includes one of the light emitting devices of the first light emitting device group and one of the lens units; and cutting the second package substrate to form units from the second light emitting device group, wherein each of the units includes one of the light emitting devices of the second light emitting device group and one of the lens units.

According to another aspect of the disclosure, a method of manufacturing a light emitting device package is provided. The method comprises preparing a growth substrate comprising a plurality of first light emitting devices and a plurality of second light emitting devices disposed on a top surface of the growth substrate. A first package substrate is prepared having a first bonding pattern corresponding to the plurality of first light emitting devices, the bonding pattern being disposed on a top surface of the first package substrate, wherein a top surface of the bonding pattern extends above the top surface of the first package substrate. The plurality of the first light emitting devices and the first bonding pattern are bonded by disposing the top surface of the growth substrate to face the top surface of the first package substrate and applying sufficient heat to bond the first light emitting devices to the first bonding pattern. The plurality of first light emitting devices are separated from the growth substrate. A lens is formed surrounding each of the plurality of first light emitting devices, and portions of the first package substrate are separated from each other, wherein each portion contains a light emitting device.

In certain embodiments, each of the first light emitting devices are spaced apart from each other by at least one other light emitting device in row, column, and diagonal directions on the growth substrate.

In certain embodiments, the first plurality of light emitting devices are separated by selectively performing a laser lift-off on the plurality of first light emitting devices.

In certain embodiments, a second package substrate is prepared having a second bonding pattern corresponding to the plurality of second light emitting devices, the bonding pattern being disposed on a top surface of the second package substrate, wherein a top surface of the bonding pattern extends above the top surface of the second package substrate. The plurality of the second light emitting devices and the second bonding pattern are bonded by disposing the top surface of the growth substrate to face the top surface of the second package substrate and applying sufficient heat to bond the second light emitting devices to the second bonding pattern. The plurality of second light emitting devices are separated from the growth substrate. A lens surrounding each of the plurality of second light emitting devices is formed, and portions of the second package substrate are separated from each other, wherein each portion contains a light emitting device.

In certain embodiments, the portions of the first package substrate are separated from each other by cutting the first package substrate.

BRIEF DESCRIPTION OF THE DRAWINGS

Exemplary embodiments of the disclosure will be more clearly understood from the following detailed description taken in conjunction with the accompanying drawings.

FIGS. 1A through 15 are views illustrating a process sequence for explaining a method for manufacturing a light emitting device package according to certain embodiments of the disclosure, in which FIGS. 1A, 2A, 7A, 8A, 12, and 14 are plan views illustrating planar views of shapes of certain components, and FIGS. 1B, 2B, 3 to 6, 7B, 8B, 9 to 11, 13, and 15 are side cross-sectional views illustrating cross-sectional views of shapes of certain components.

DETAILED DESCRIPTION OF THE EMBODIMENTS

Figure 1A:
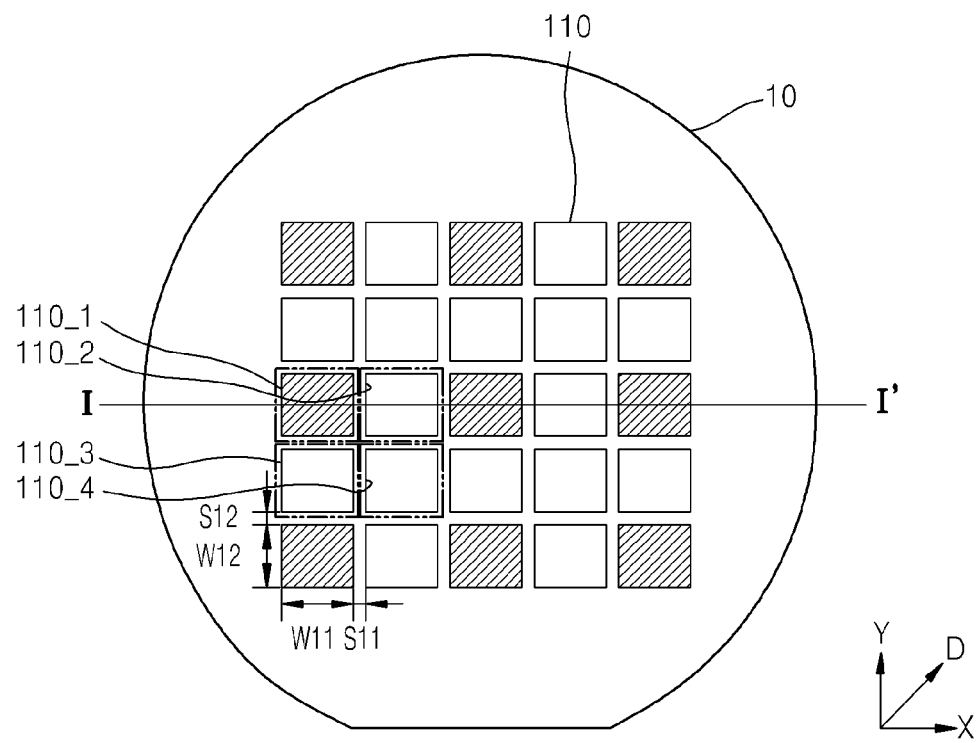

As used herein, the term "and/or" includes any and all combinations of one or more of the associated listed items. Expressions such as "at least one of", when preceding a list of elements, modify the entire list of elements and do not modify the individual elements of the list.

Hereinafter, exemplary embodiments of the inventive concept will be described in detail with reference to the accompanying drawings. Like reference numerals in the drawings denote like elements, and thus their description will be omitted.

The inventive concept may, however, be embodied in many different forms and should not be construed as being limited to the embodiments set forth herein; rather, these embodiments are provided so that this disclosure will be thorough and complete, and will fully convey the inventive concept to those skilled in the art.

Also, though terms like a first and a second are used to describe various members, components, regions, layers, and/or portions in various embodiments of the inventive concept, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment can be referred to as a second member, a second component, a second region, a second layer, or a second portion in another embodiment. For example, a first component can be referred to as a second component, and similarly, the second component can be referred to as the first component.

Unless defined differently, all terms used herein include technical terms and scientific terms, and have the same meanings as understood in common by those skilled in the art to which the inventive concept pertains. Also, terms as defined in dictionaries, being generally used, should be construed as having the consistent meanings in the context of the related technology, and should not be construed as excessively formal meanings unless explicitly defined herein.

When any embodiment can be implemented in different ways, a specific process order can also be performed differently from the order described herein. For example, two processes described sequentially can also be performed at the substantially same time, and can also be performed in the order opposite to the order described herein.

In the accompanying drawings, for example, modifications of described shapes can be expected according to the manufacturing technology. Therefore, embodiments of the inventive concept should not be construed as being limited to a specific shape shown in this specification, and for example, should include variations of the shape incurred in the manufacturing processes.

FIGS. 1A through 15 are views illustrating a process sequence for explaining a method for manufacturing a light emitting device package according to certain embodiments of the disclosure, in which FIGS. 1A, 2A, 7A, 8A, and 12 to 17C are plan views illustrating planar views of shapes of certain components, and FIGS. 1B, 2B, 3 to 6, 7B, 8B, and 9 to 11 are side cross-sectional views illustrating cross-sectional views of shapes of certain components.

Figure 1B:
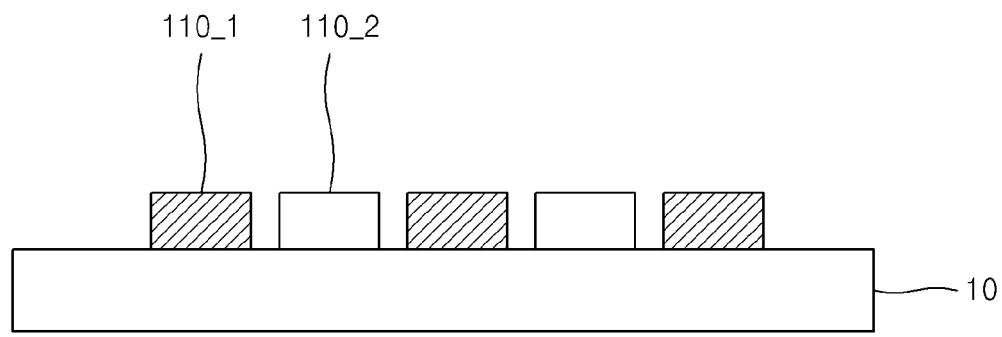

FIG. 1A is a plan view illustrating a main part of a growth substrate 10 according to certain embodiments of the disclosure. FIG. 1B is a cross-sectional view taken along line I-I' of FIG. 1A. For convenience of explanation, only five light emitting devices are shown as formed in each row and column in FIGS. 1A and 1B, but the disclosure is not limited thereto.

Referring to FIGS. 1A and 1B, the growth substrate 10 in which a plurality of light emitting devices 110 are formed on a top surface thereof is prepared.

The plurality of light emitting devices 110 may be sequentially arranged along the row direction (X-direction) and the column direction (Y-direction) so as to form a matrix shape on the top surface of the growth substrate 10. The plurality of light emitting devices 110 may form a matrix shape in which first light emitting devices 110_1 disposed at the left top of a unit, second light emitting devices 110_2 adjacent thereto in the row direction (X-direction), third light emitting devices 110_3 adjacent thereto in the column direction (Y-direction), and fourth light emitting devices adjacent thereto in the diagonal direction are repeatedly arranged. As described later, the first to fourth light emitting devices 110_1 to 110_4 may be sequentially mounted on first to fourth package substrates (see 20 to 50 of FIGS. 2A to 15), respectively. However, the mounting order is not limited thereto, but the first to fourth light emitting devices 110_1 to 110_4 may be mounted in the corresponding first to fourth package substrates 20 to 50 in various orders. For example, the first light emitting devices 110_1, the third light emitting devices 110_3, the second light emitting devices 110_2, and the fourth light emitting devices 110_4 may also be sequentially mounted in their corresponding package substrates. Hereinafter, it will be noted that light emitting devices mounted in corresponding package substrates are shaded in the accompanying drawings for convenience of explanation.

The plurality of light emitting devices 110 may have a first width W11 in the row direction (X-direction) and a second width W12 in the column direction (Y-direction). The first and second widths W11 and W12 may vary in size according to required device characteristics and process conditions. In FIG. 1, the plurality of light emitting devices 110 are shown as having the same area, e.g., the substantially same first width W11 and second width W12, but the disclosure is not limited thereto. The plurality of light emitting devices 110 may each have a different area. Hereinafter, the plurality of light emitting devices 110 will be illustrated as each having the first width W11 and second width W12 of the substantially same size for convenience of explanation.

The plurality of light emitting devices 110 may be arranged so as to be spaced apart from one other by a first gap S11 in the row direction (X-direction) and a second gap S12 in the column direction (Y-direction). The first gap S11 and the second gap S12 may be formed to have a minimum size to reduce a loss of the growth substrate 10. Hereinafter, the first gap S11 and the second gap S12 will be illustrated as having the substantially same size for convenience of explanation.

In certain embodiments, the plurality of light emitting devices 110 may be formed by growing each semiconductor layer on the top surface of the growth substrate 10 through a process such as Metal Organic Chemical Vapor Deposition (MOCVD), Molecular Beam Epitaxy (MBE), or Hybride Vapor Phase Epitaxy (HVPE) and then individually separating the semiconductor layers through dicing.

In certain embodiments, the growth substrate 10 may be an insulating substrate that has good deposition characteristics due to a crystal lattice constant similar to that of the semiconductor layer constituting the light emitting device 110. For example, the growth substrate 10 may be a sapphire ($Al_2O_3$) substrate, a spinel ($MgAl_2O_4$) substrate, a silicon carbide (SiC) substrate, or a gallium nitride (GaN) substrate.

In certain embodiments, the growth substrate 10 may have an unevenness (not shown) formed in the whole of the top surface thereof or in an interface between the plurality of light emitting devices 110.

In certain embodiments, the plurality of light emitting devices 110 may be formed of Light Emitting Diode (LED) chips. The LED chips may emit light such as blue light, green light, and red light according to the types of the compound semiconductor. Alternatively, the LED chips may emit ultraviolet rays. In certain other embodiments, the plurality of light emitting devices 110 may be formed of a UV ray diode chip, a laser diode chip, or an organic light emitting diode. However, according to the disclosure, the plurality of light emitting devices 110 are not limited to those exemplified above, but may be configured with various types of optical device.

In certain embodiments, each of light emitting devices 110 may adopt a flip chip structure, a vertical electrode structure, or a vertical horizontal electrode structure. Hereinafter, although not shown in FIGS. 1A and 1B, each of light emitting devices 110 will be illustrated as having a flip chip structure including an electrode formed on the top surface thereof.

Figure 2A:
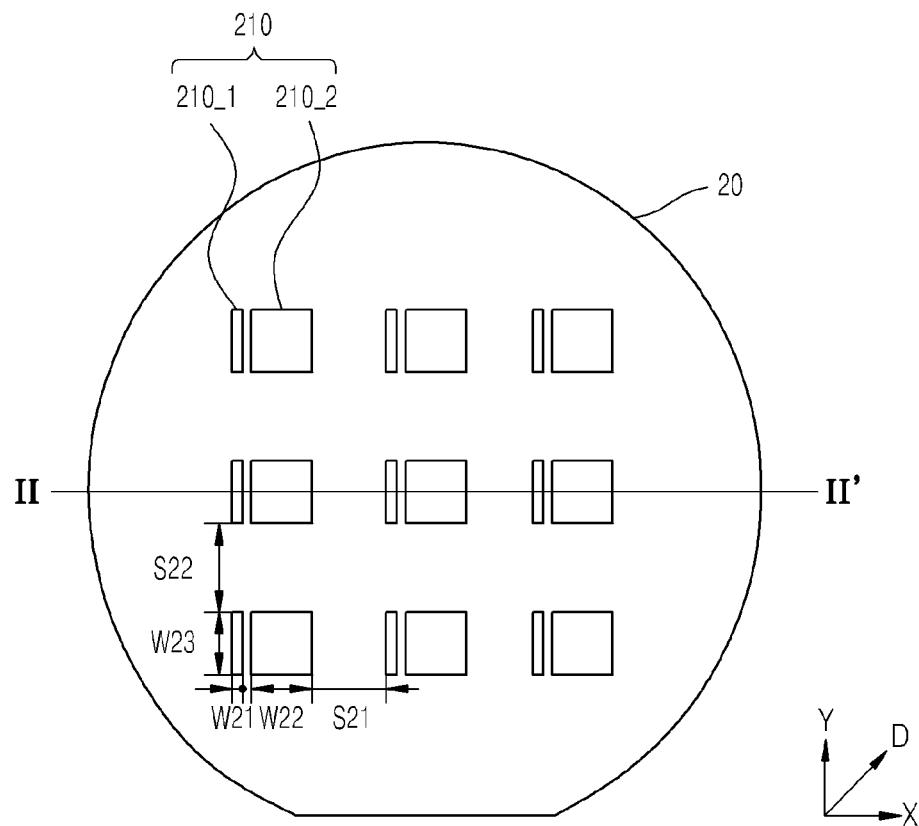
Figure 2B:
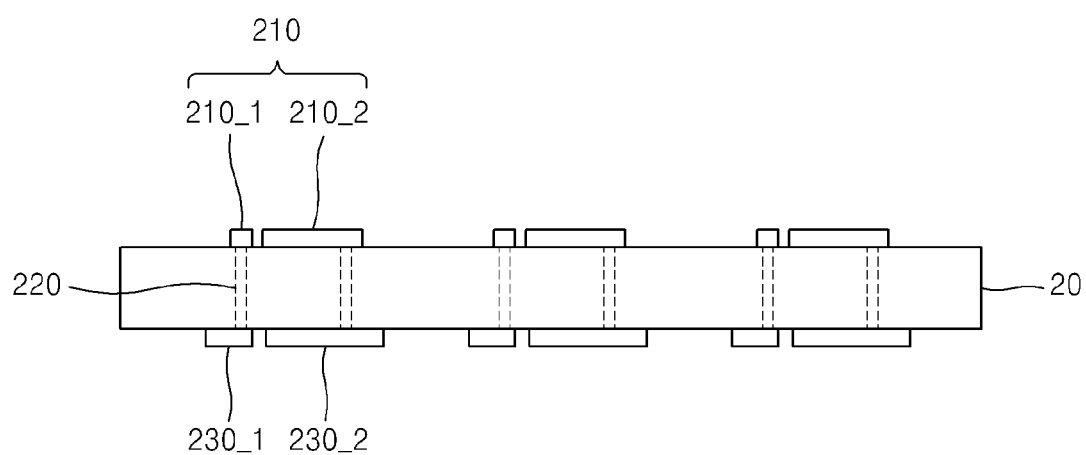

FIG. 2A is a plan view illustrating a main part of a first package substrate 20 according to certain embodiments of the disclosure. FIG. 2B is a cross-sectional view taken along line II-II' of FIG. 2A. For convenience of explanation, three bonding patterns are shown as being formed in each row and column in FIGS. 2A and 2B, but embodiments are not limited thereto. For example, the bonding patterns may be further formed in each row and column according to the number of corresponding light emitting devices.

Referring to FIGS. 1A to 2B, a first package substrate 20 having first bonding patterns 210 formed on the top surface thereof is prepared.

The first bonding patterns 210 may each include a first conductive region 210_1 and a second conductive region 210_2, and the first bonding patterns 210 may be formed at locations corresponding to the first light emitting devices 110_1 disposed on the growth substrate 10. Specifically, for each of the first bonding patterns 210, the first conductive region 210_1 and the second conductive region 210_2 may be formed at a location where at least a portion of the first conductive region 210_1 and the second conductive region 210_2 overlaps a corresponding first light emitting device 110_1 so as to bond electrodes of the corresponding first light emitting device 110_1 in a subsequent bonding process (see FIG. 3). Thus, in the subsequent bonding process, only the first light emitting devices 110_1 that are not adjacent to each other among the plurality of light emitting devices 110 on the growth substrate 10 and are spaced apart from one other by at least one light emitting device in the row direction (X-direction), the column direction (Y-direction), and the diagonal direction (D-direction) may be mounted in the first package substrate 20.

The first conductive region 210_1 may have a third width W21 in the row direction (X-direction) and a fourth width W23 in the column direction (Y-direction), and the second conductive region 210_2 may have a fifth width W22 in the row direction (X-direction) and the fourth width W23 in the column direction (Y-direction). The sizes of the third width W21 to the fifth width W22 may be variously set such that at least a portion of the corresponding first conductive region 210-1 and second conductive region 210_2 can overlap the first light emitting device 110_1.

The sizes of the third width W21 to the fifth width W22 may be set so as not to overlap the first light emitting devices 110_1 and light emitting devices adjacent thereto in the row direction (X-direction), the column direction (Y-direction), and the diagonal direction (D-direction) at the same time.

In certain embodiments, the sizes of the third width W21 to the fifth width W22 may also be set so as to overlap the first light emitting devices 110_1 and light emitting devices adjacent thereto in the row direction (X-direction), the column direction (Y-direction), and the diagonal direction (D-direction). However, in this case, an intermediate layer (not shown) needs to be disposed under the first conductive region 210_1 and the second conductive region 210_2, or the first conductive region 210_1 and the second conductive region 210_2 need to be formed to have a step in a vertical direction such that the first light emitting device 110_1 and the light emitting devices adjacent thereto do not join with the first conductive region 210_1 and the second conductive region 210_2. The intermediate layer may be formed of the same material as the corresponding conductive region, but embodiments are not limited thereto.

Meanwhile, the third width W21 and the fifth width W22 are shown as having different sizes in FIGS. 2A and 2B, but the disclosure is not limited thereto. Also, the first conductive region 210_1 and the second conductive region 210_2 are shown as having the fourth width W23 of the same size in the column direction (Y-direction), but the disclosure is not limited thereto.

The first bonding patterns 210 may be formed to be spaced from one other by a third gap S21 in the row direction and a fourth gap S22 in the column direction (Y-direction). The third gap S21 and the fourth gap S22 may have the same or different sizes.

The first bonding patterns 210 may be formed such that the first conductive region 210_1 and/or the second conductive region 210_2 have a step of a vertical direction in accordance with the electrode structure of the first light emitting devices 110_1. Also, in FIG. 2B, the first bonding patterns 210 are shown as being formed in a single layer, but the disclosure is not limited thereto. For example, the first conductive region 210_1 and the second conductive region 210_2 of the first bonding patterns 210 may be implemented in a plurality of layers, respectively.

The first package substrate 20 may further include a first lower electrode 230_1 and a second electrode 230_2, and through electrodes 220 that penetrate the first package substrate 20. The first lower electrode 230_1 and the second lower electrode 230_2 may be respectively electrically connected to the first conductive region 210_1 and the second conductive region 210_2 through the through electrodes 220. The first lower electrode 230_1 and the second lower electrode 230_2 may allow the first package substrate 20 to be electrically connected to a Printed Circuit Board (PCB; not shown) or an external apparatus.

In certain embodiments, the first bonding patterns 210 may be formed by forming a metallic material film (not shown) with excellent electrical conductivity and joining characteristics by a process such as Chemical Vapor Deposition (CVD) or Physical Vapor Deposition (PVD) and then performing patterning by a photolithography or lift-off process. Alternatively, the first bonding patterns 210 may also be formed by a plating process. The metallic material film may be formed of a material such as Au, Sn, Pb, Ag, In, Ge, Si or a combination thereof. In certain embodiments the metallic material film is a low melting point material such as Au—Sn alloy, Ni—Sn alloy, or Cu—Sn alloy.

In certain embodiments, the first package substrate 20 may be an insulating substrate. For example, the first package substrate 20 may be a silicon substrate, a ceramic substrate, an aluminum nitride (AlN) substrate, a sapphire ($Al_2O_3$) substrate, or an FR4 substrate.

Figure 3:
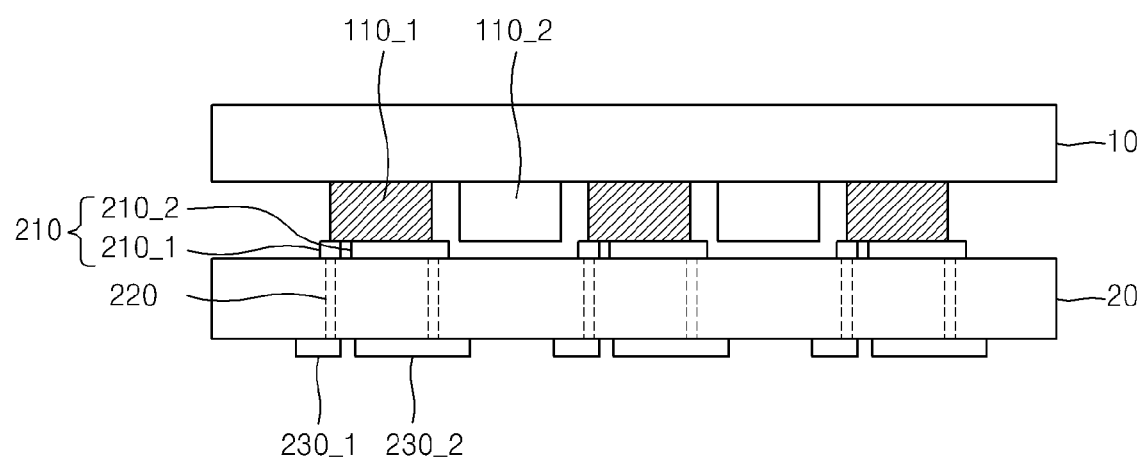

FIG. 3 is a cross-sectional view illustrating a step of bonding the first light emitting devices 110_1 and the first package substrate 20 according to certain embodiments of the disclosure.

Referring to FIGS. 1A to 3, the top surface of the growth substrate 10 may be disposed to face the top surface of the first package substrate 20 such that the first light emitting devices 110_1 of the plurality of light emitting devices 110 face the first bonding pattern 210. Thereafter, heat may be applied to bond the first and second electrodes (not shown) on the uppermost surface of the first light emitting devices 110_1 with the first conductive region 210_1 and the second conductive region 210_2 of the first bonding pattern 210.

Figure 4:
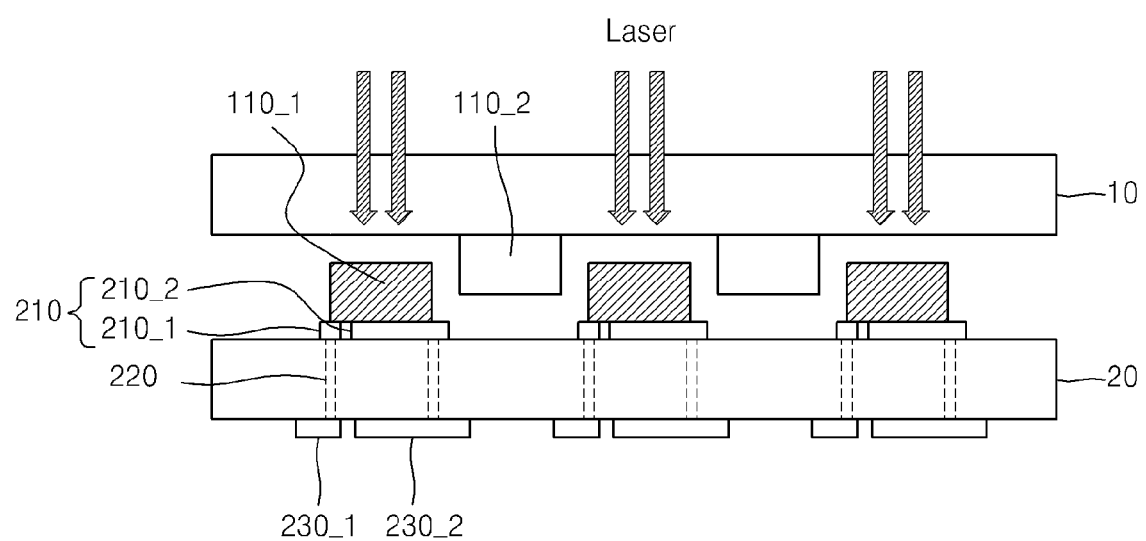

FIG. 4 is a cross-sectional view illustrating a step of selectively separating the first light emitting devices 110_1 from the growth substrate 10 according to certain embodiments of the disclosure.

Referring to FIG. 1A to 4, a laser beam may be selectively irradiated on interfaces between the first light emitting devices 110_1 of the plurality of light emitting devices 110 and the growth substrate 10 from the bottom surface of the growth substrate 10 to separate the first light emitting devices 110_1 from the growth substrate 10. In FIG. 4, the first light emitting devices 110_1 are shown as being selectively separated by a laser lift-off process, but the embodiments are not limited thereto. In certain embodiments, the first light emitting devices 110_1 may be selectively separated by a chemical lift-off process.

Meanwhile, when an unevenness structure is not formed in the top surface of the substrate 10, if necessary, an unevenness structure may be formed in the bottom surface of the first light emitting device 110_1 by a photolithography process or an etching process to improve the light extraction efficiency of the light emitting device package.

Figure 5:
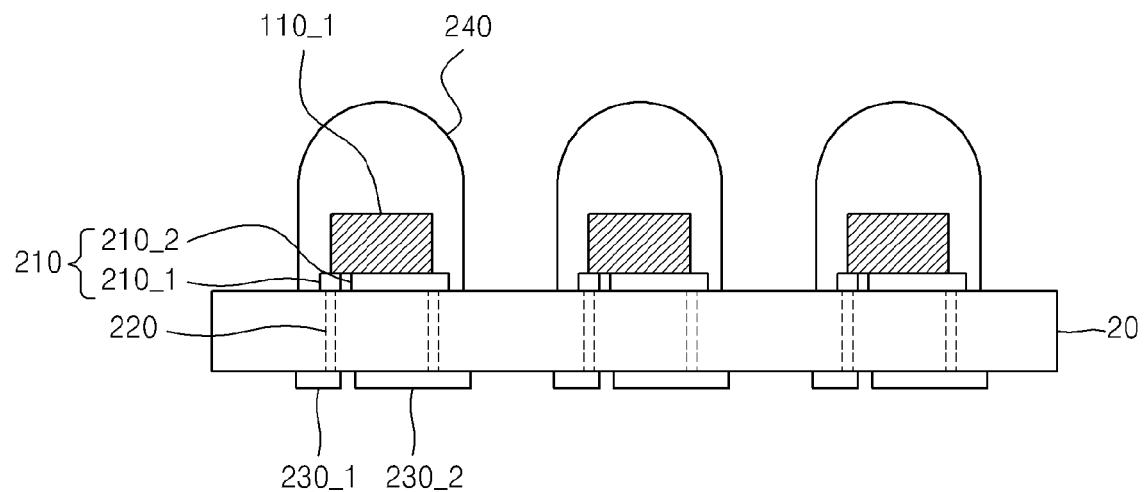

FIG. 5 is a cross-sectional view illustrating a step of forming lens units 240 over the first light emitting devices 110_1 on the first package substrate 20 according to certain embodiments of the disclosure.

Referring to FIGS. 1A to 5, the lens units 240 may be formed to surround the first light emitting devices 110_1 on the first package substrate 20. The lens unit 240 may be formed to surround the entire first bonding pattern 210. However, the disclosure is not limited thereto, and the lens unit 240 may also be formed such that a portion of the first conductive region 210_1 and/or the second conductive region 210_2 is exposed.

In certain embodiments, the inside of the lens unit 240 may be filled with silicon resin, epoxy resin, plastic, or glass. In certain other embodiments, a refractive member (not shown) may also be included inside the lens unit 240. The refractive member (not shown) may refract or reflect light emitted from the first light emitting devices 110_1. In certain other embodiments, the lens unit 240 may include a fluorescent substance (not shown). The fluorescent substance may include at least one of a yellow fluorescent substance, a green fluorescent substance, a red fluorescent substance, and a blue fluorescent substance.

Figure 6:
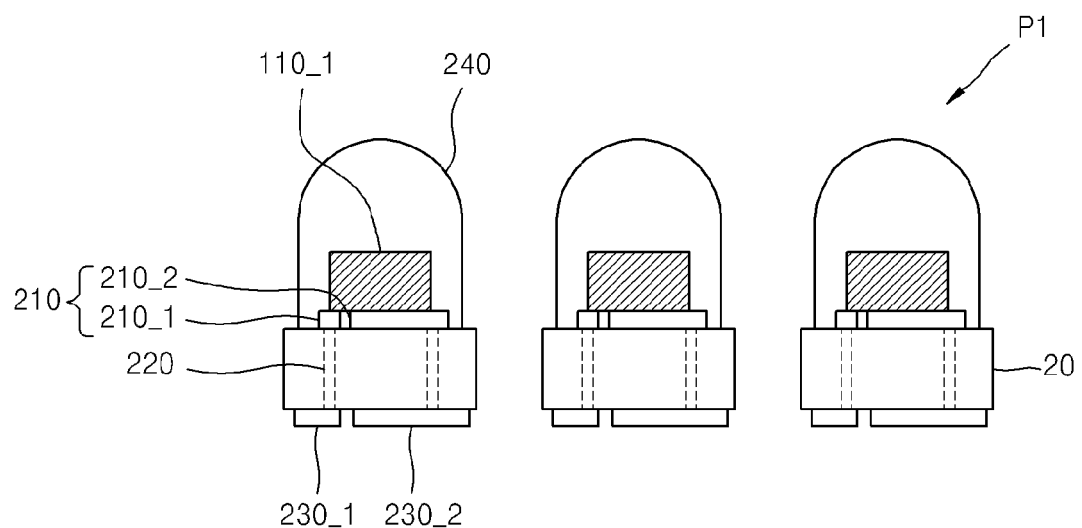

FIG. 6 is a cross-sectional view illustrating a step of individually separating the first light emitting devices 110_1 according to certain embodiments of the disclosure.

Referring to FIGS. 1 to 6, a light emitting package P1 may be formed by cutting the first package substrate 20 into units of the first light emitting devices 110_1 modularized by the lens unit 240.

In certain embodiments, a diamond sawing or laser cutting process may be used to cut off the first package substrate 20.

Figure 7A:
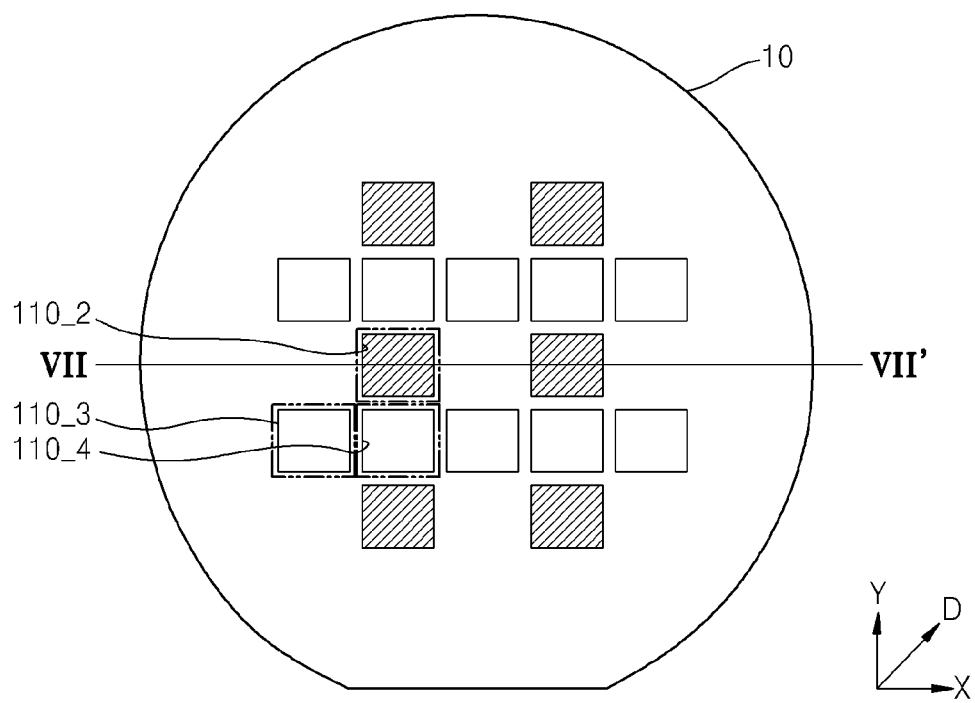
Figure 7B:
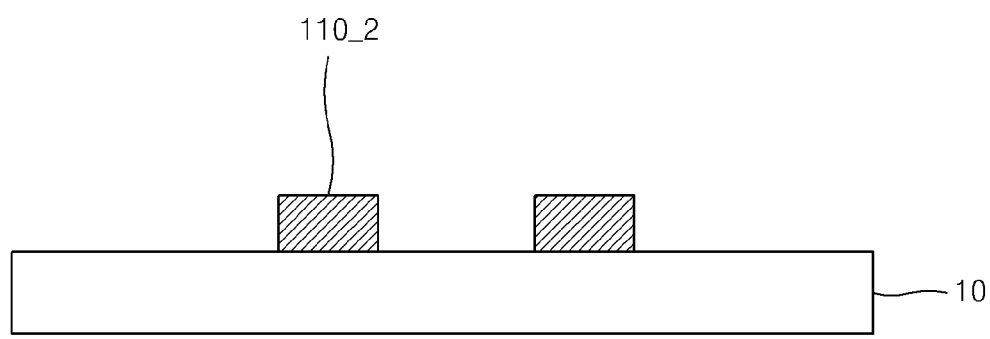

FIG. 7A is a plan view illustrating a main part of the growth substrate 10 according to certain embodiments of the disclosure, and FIG. 7B is a cross-sectional view taken along line VII-VII'. FIGS. 7A and 7B illustrate a state after the first light emitting devices 110_1 have been separated from the growth substrate 10 of FIGS. 1A and 1B. For explanation of FIGS. 7A and 7B, the same reference numerals as FIGS. 1A and 1B indicate the same members, and detailed descriptions thereof will be omitted herein to simplify the description.

Referring to FIGS. 7A and 7B, the growth substrate 10 is prepared, on which the second to fourth light emitting devices 110_2 to 110_4 of the plurality of light emitting devices remain, whereas the first light emitting devices 110_1 of the plurality of light emitting devices have been separated from the growth substrate 10.

The second light emitting devices 110_2 may be light emitting devices arranged in the same row as the first light emitting devices 110_1 separated from the growth substrate 10. The second light emitting devices 110_2 may be adjacent to the fourth light emitting devices 110_4 in the column direction (Y-direction), and may be adjacent to the third light emitting devices 110_3 in the diagonal direction (D-direction). As described later, the second light emitting devices 110_2 of the second to fourth light emitting devices 110_2 to 110_4 may be first mounted in a second package substrate 30 (see FIGS. 8A to 11), but this is merely for convenience of explanation. In other embodiments, the third light emitting devices 110_3 or the fourth light emitting devices 110_4 may also be preferentially mounted in each corresponding third package substrate 40 or fourth package substrate 50 (see FIGS. 12 to 15).

Figure 8A:
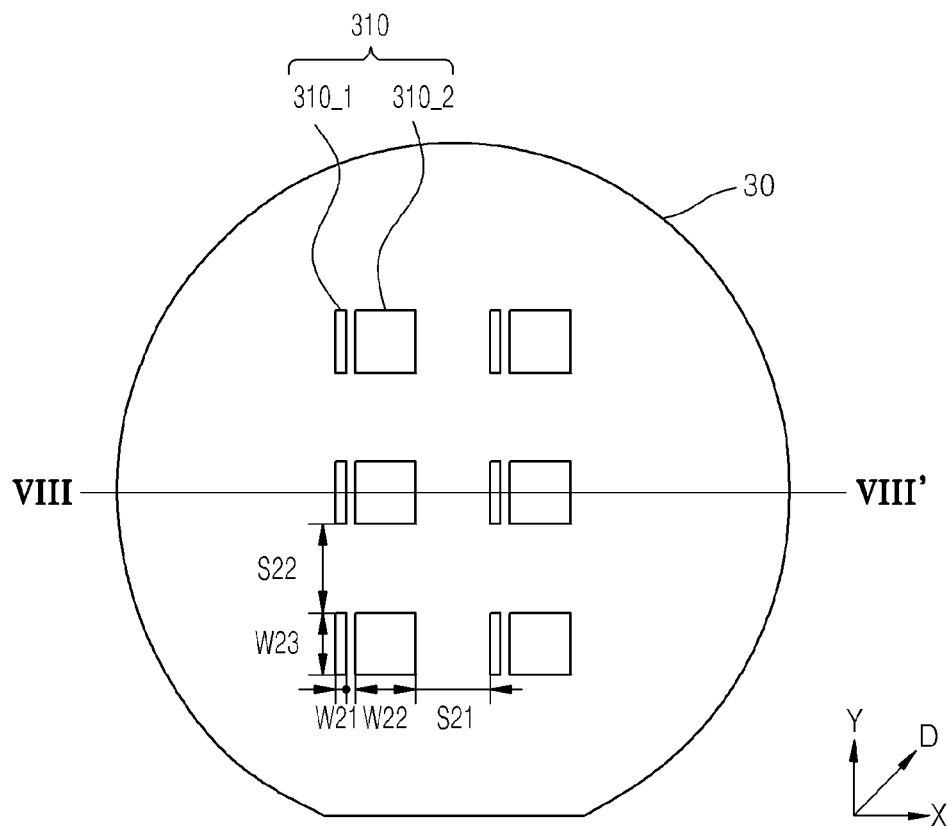
Figure 8B:
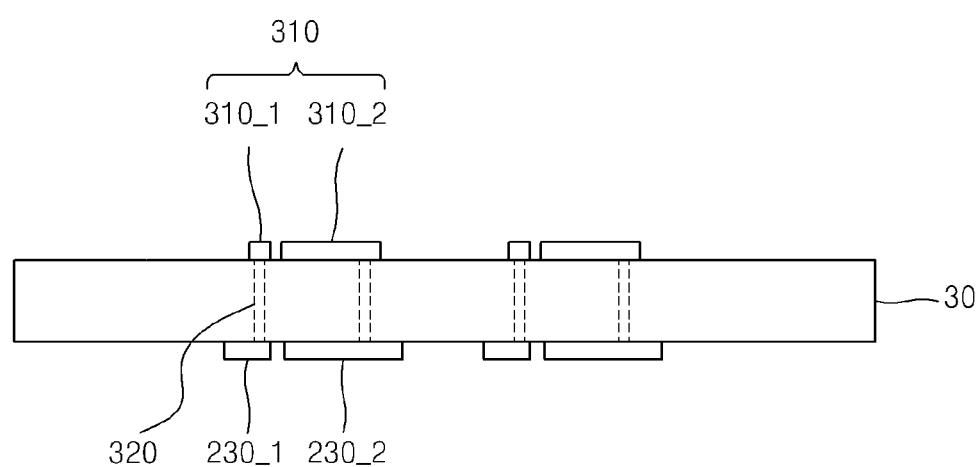

FIG. 8A is a plan view illustrating a main part of the second package substrate 30 according to certain embodiments of the disclosure. FIG. 8B is a cross-sectional view taken along line VIII-VIII'. For explanation of FIGS. 8A and 8B, the same or similar reference numerals as FIGS. 2A and 2B indicate the same or similar members, and detailed descriptions thereof will be omitted herein to simplify the description.

Referring to FIGS. 7A to 8B, the second package substrate 30 having second bonding patterns 310 formed on the top surface thereof is prepared.

The second bonding patterns 310 may each include a first conductive region 310_1 and a second conductive region 310_2, and the second bonding patterns 310 may be formed at locations corresponding to the second light emitting devices 110_2 disposed on the growth substrate 10. Specifically, for each of the second bonding patterns 310, the first conductive region 310_1 and the second conductive region 310_2 may be formed at a location where at least a portion of the first conductive region 310_1 and the second conductive region 310_2 overlaps a corresponding second light emitting device 110_2 so as to bond electrodes of the corresponding second light emitting device 110_2 in a subsequent bonding process (see FIG. 9). Thus, in the subsequent bonding process, only the second light emitting devices 110_2 that are not adjacent to each other among the plurality of light emitting devices on the growth substrate 10 and are spaced apart from one other by at least one light emitting device in the column direction (Y-direction) and the diagonal direction (D-direction) may be mounted in the second package substrate 30.

Meanwhile, the second package substrate 30 may correspond to a separate substrate from the first package, and may be an insulating substrate formed of the same or different material as the first package substrate 20. Also, the second package substrate 30 may have a configuration that corresponds to that of first package substrate 20, although it may be different than the first package substrate 20. For example, the second package substrate 30 may further include a first lower electrode 330_1 and a second lower electrode 330_2 disposed on the undersurface of the second package substrate 30, and through electrodes 320 that penetrate the second package substrate 30 (FIG. 8b is labeled differently with "230_1" and "230_2").

Figure 9:
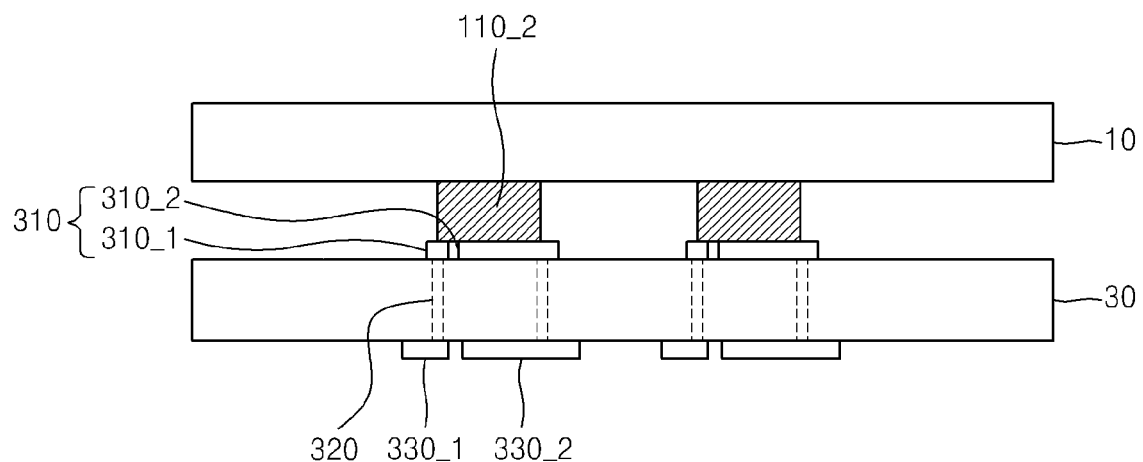
Figure 10:
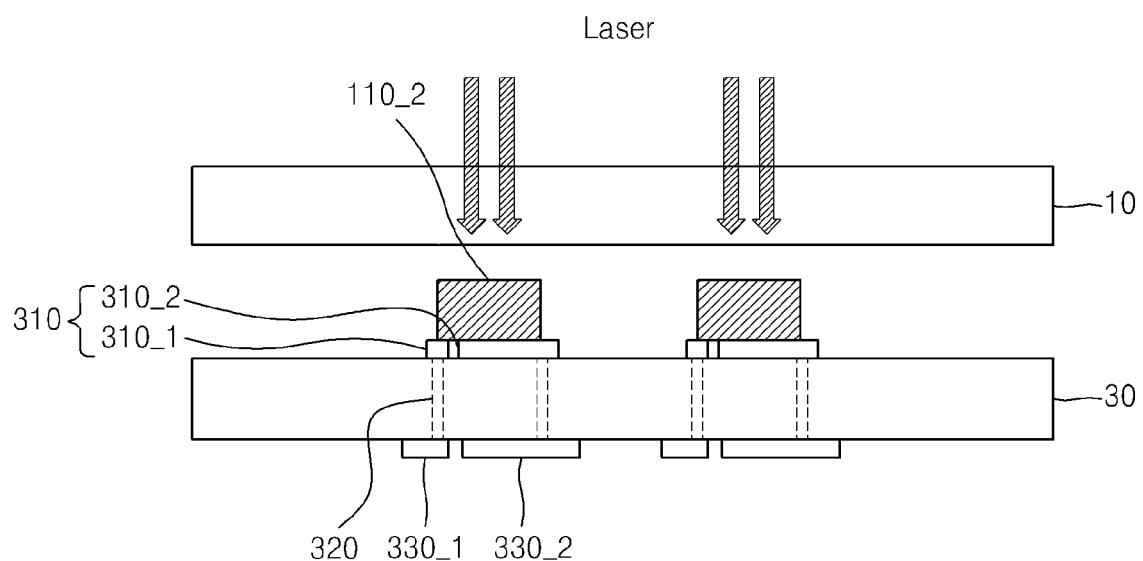
Figure 11:
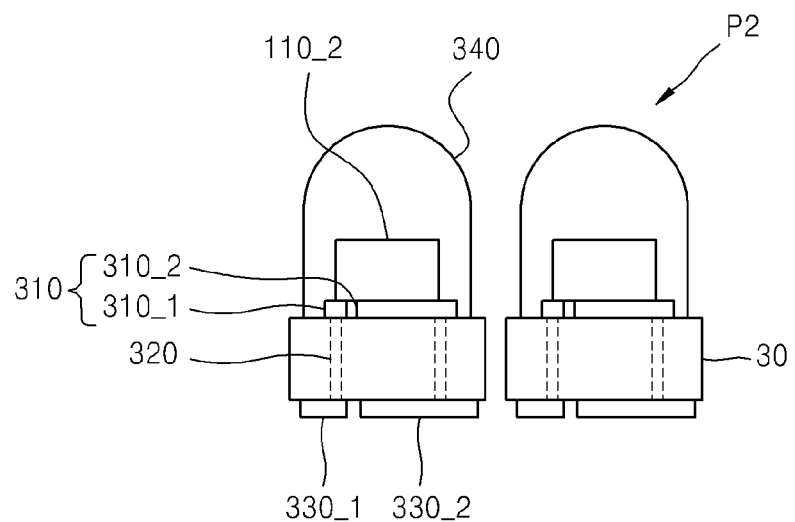

FIG. 9 is a cross-sectional view illustrating a step of bonding the second light emitting devices 110_2 and the second package substrate 30 according to certain embodiments of the disclosure, and FIG. 10 is a cross-sectional view illustrating a step of selectively separating the second light emitting devices 110_2 from the growth substrate 10 according to certain embodiments of the disclosure. Also, FIG. 11 is a cross-sectional view illustrating a step of packaging the second light emitting devices 110_2 according to certain embodiments of the disclosure. For explanation of FIGS. 9 to 11, FIGS. 3 to 6 will be referred to. However, since reference numerals corresponding to those of FIGS. 3 to 6 indicate the same or corresponding members, detailed descriptions thereof will be omitted herein to simplify the description.

Referring to FIGS. 7A to 11, the top surface of the growth substrate 10 and the top surface of the first package substrate 20 (second package substrate 30) may face each other to bond the light emitting devices 110_2 with the second bonding pattern 310 on the top surface of the second package substrate 30. Thereafter, the second light emitting devices 110_2 may be selectively separated from the growth substrate 10, and lens units 340 may then be formed to surround the second light emitting devices 110_2 over the second package substrate 30, respectively. Then, a light emitting device package P2 may be formed by cutting the second package substrate 30 into units of second light emitting devices 110_2 modularized by the lens unit 340.

Figure 12:
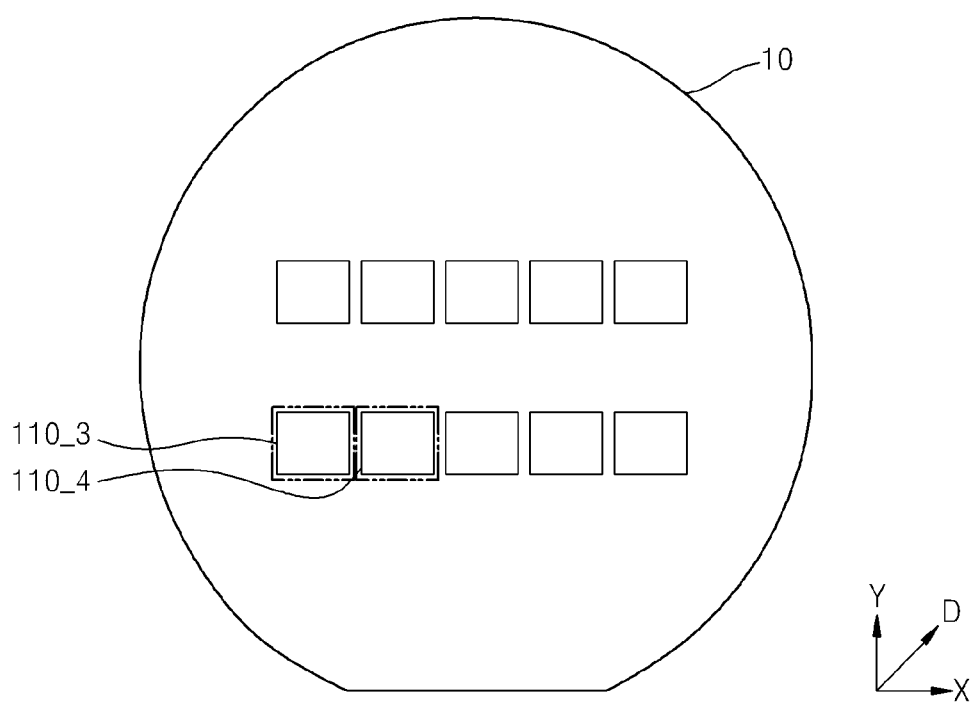

FIG. 12 is a plan view illustrating a main part of the growth substrate 10 according to certain embodiments of the disclosure, and illustrates a state after the second light emitting devices 110_2 have been separated from the growth substrate 10 of FIGS. 7A and 7B. For explanation of FIG. 12, the same reference numerals as FIGS. 7A and 7B indicate the same members, and detailed descriptions thereof will be omitted herein to simplify the description.

Referring to FIG. 12, the growth substrate 10 is prepared, on which the third and fourth light emitting devices 110_3 and 110_4 of the plurality of light emitting devices remain, whereas the first and second light emitting devices 110_1 and 110_2 of the plurality of light emitting devices have been separated from the growth substrate 10.

The third light emitting devices 110_3 may be adjacent to the fourth light emitting device 110_4 in the row direction (X-direction). As described later, the third light emitting devices 110_3 of the third and fourth light emitting devices 110_3 and 110_4 may be first mounted in a third package substrate 40 (see FIG. 13), but this is merely for convenience of explanation. In other embodiments, the fourth light emitting devices 110_4 may also be preferentially mounted in the corresponding fourth package substrate 50 (see FIGS. 14 to 15).

Figure 13:
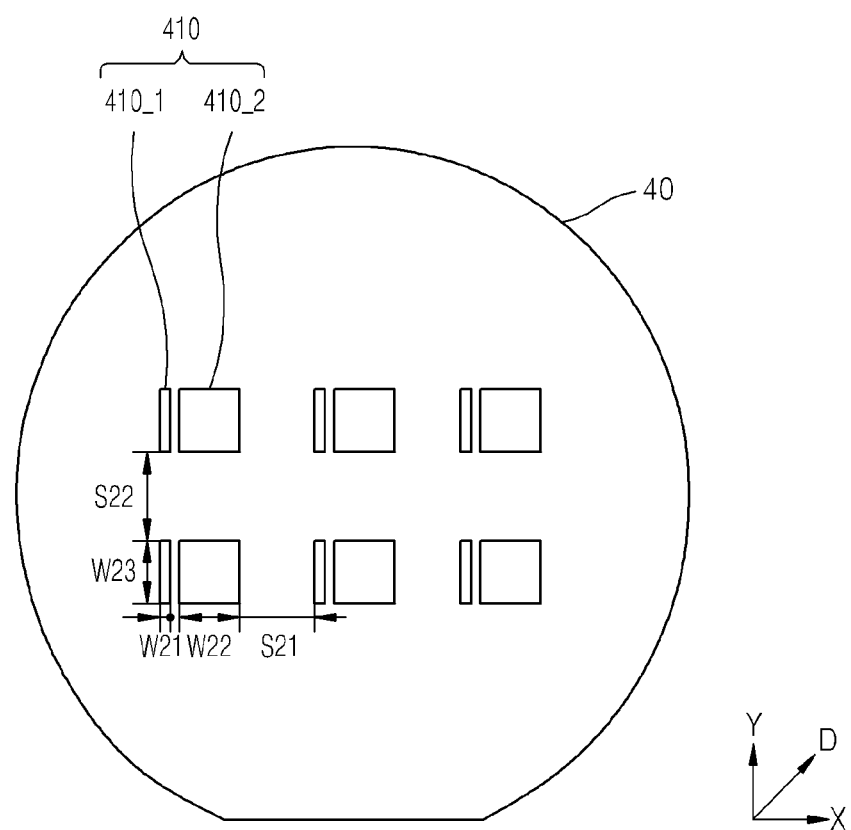

FIG. 13 is a plan view illustrating a main part of a third package substrate 40 according to certain embodiments of the disclosure. For explanation of FIG. 13, reference numerals corresponding to those of FIGS. 8A and 8B indicate the same or corresponding members, and detailed descriptions thereof will be omitted herein to simplify the description.

Referring to FIGS. 12 and 13, the third package substrate 40 having third bonding patterns 410 formed on the top surface thereof is prepared.

The third bonding patterns 410 may each include a first conductive region 410_1 and a second conductive region 4102, and the third bonding patterns 410 may be formed at locations corresponding to the third light emitting devices 110_3 disposed on the growth substrate 10. Specifically, for each of the third bonding patterns 410, the first conductive region 410_1 and the second conductive region 410_2 may be formed at a location where at least a portion of the first conductive region 410_1 and the second conductive region 410_2 overlaps a corresponding third light emitting device 110_3 so as to bond electrodes of the corresponding third light emitting device 110_3 in a subsequent joining process. Thus, in the subsequent bonding process, only the third light emitting devices 110_3 that are not adjacent to each other among the plurality of light emitting devices on the growth substrate 10 and are spaced apart from one other by at least one light emitting device in the row direction (X-direction) may be mounted in the third package substrate 40.

Thus, similar to the manufactured light emitting device packages of FIGS. 3 to 6 or FIGS. 9 to 11, light emitting device packages including the third light emitting devices 110_3 can be manufactured by separating only the third light emitting devices 110_3 from the growth substrate 10, mounting the third light emitting devices 110_3 in the third package substrate 40, and then performing subsequent processes.

Figure 14:
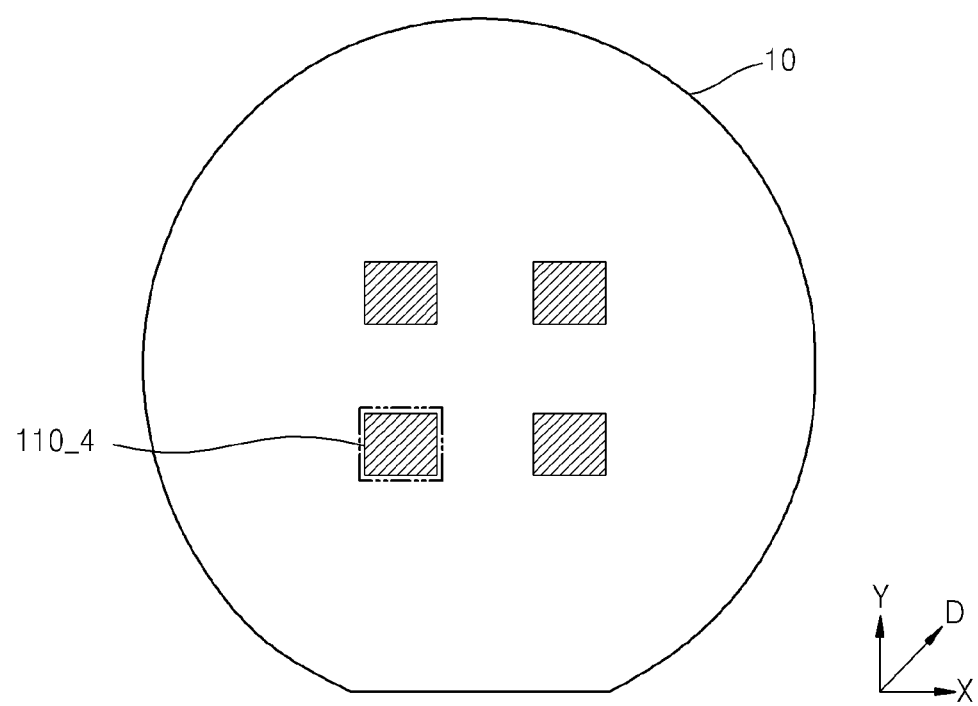
Figure 15:
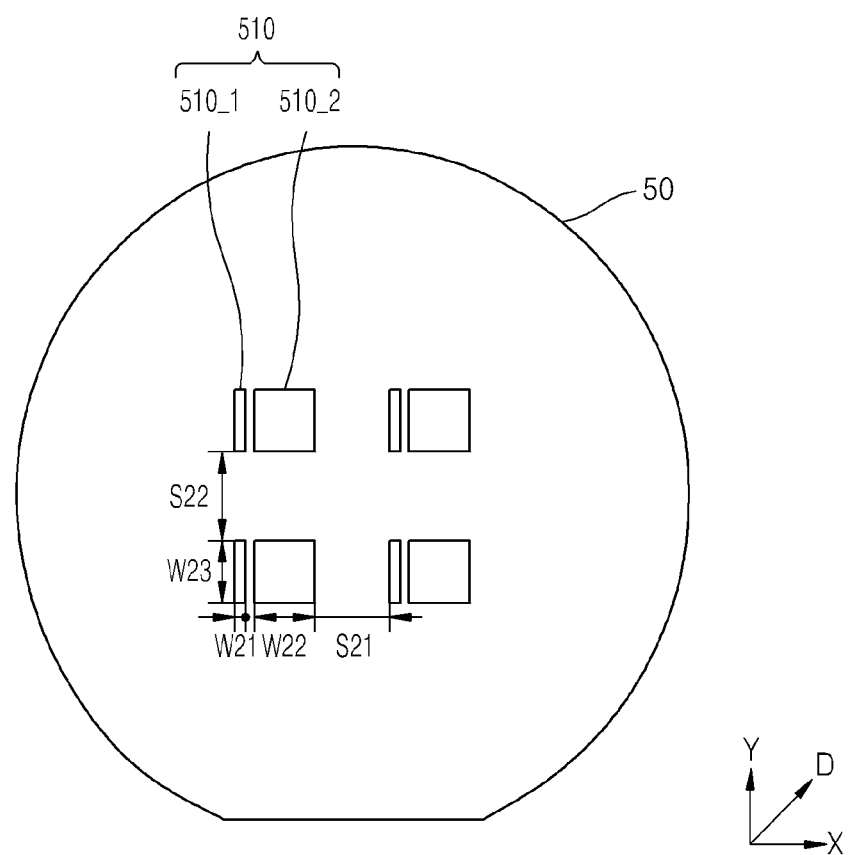
Figure 16A:
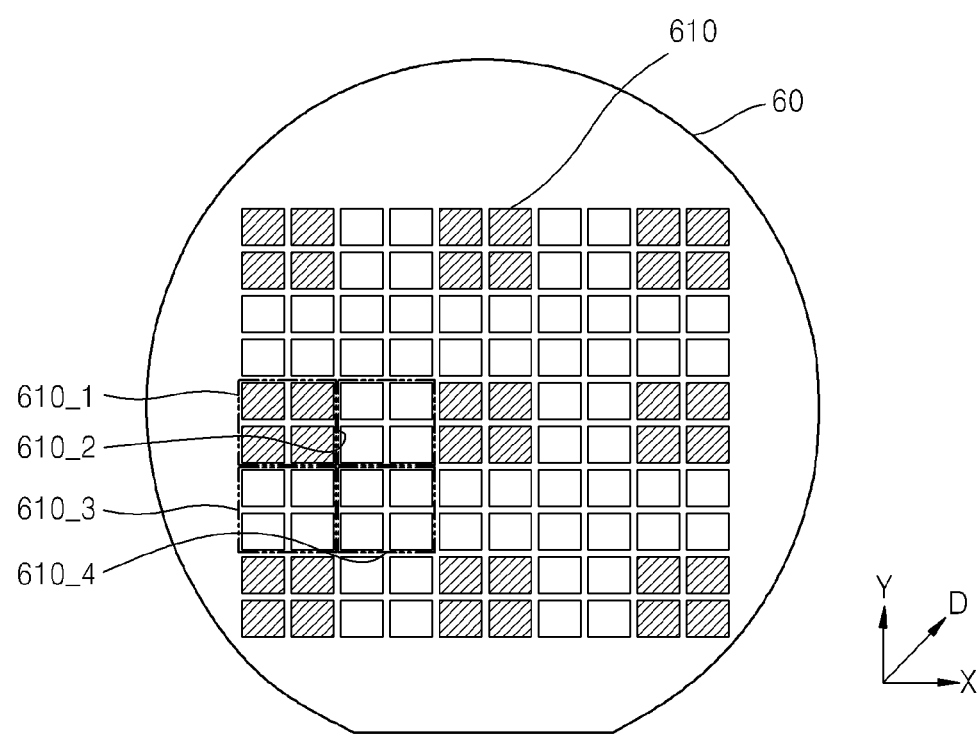
FIGS. 16A through 16D are plan views illustrating planar shapes of a growth substrate based on the order of the light emitting devices being mounted on a package substrate according to certain other embodiments of the disclosure.
Figure 16B:
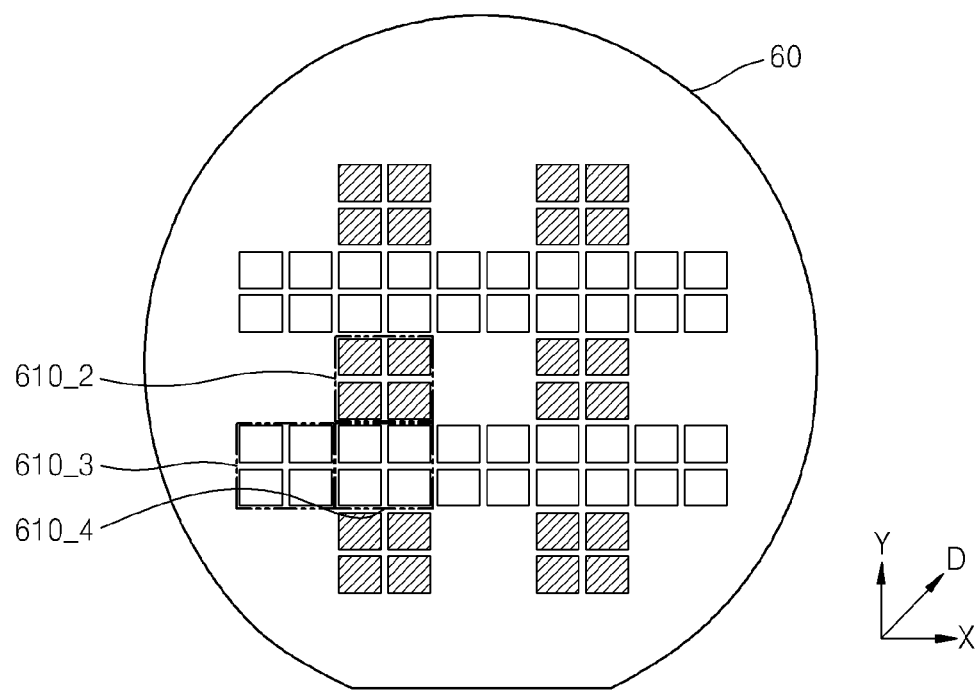
Figure 16C:
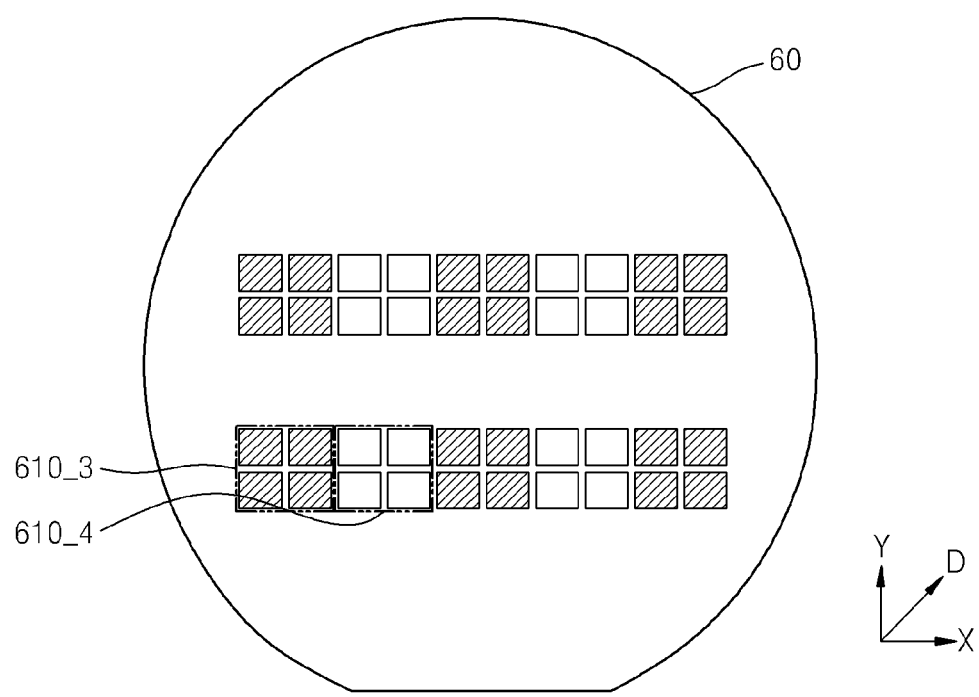
Figure 16D:
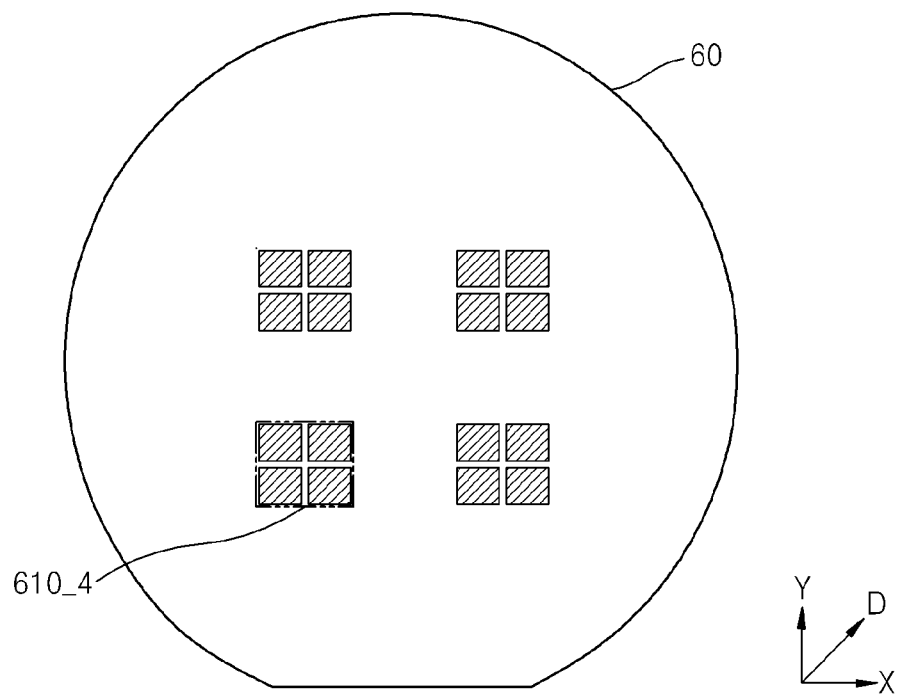

FIG. 14 is a plan view illustrating a main part of the growth substrate 10 according to certain embodiments of the disclosure, and illustrates a state after the third light emitting devices 110_3 have been separated from the growth substrate 10 of FIG. 12. FIG. 15 is a plan view illustrating a main part of a fourth package substrate 50 according to certain embodiments of the disclosure.

Referring to FIGS. 14 and 15, the fourth light emitting devices 110_4 that finally remain in the growth substrate 10 may be mounted in the fourth package substrate 50.

Similar to the manufactured light emitting device packages of FIGS. 3 to 6 or FIGS. 9 to 11, the fourth light emitting devices 110_4 may be mounted in the fourth package substrate 50, and then the fourth light emitting devices 110_4 may be separated from the growth substrate 10. Thereafter, light emitting device packages including the fourth light emitting devices 110_4 can be manufactured through subsequent processes.

As described with reference to FIGS. 1A to 15, a method for manufacturing a light emitting device package according to an embodiment of the disclosure may include mounting, onto the first package substrate 20, only the first light emitting devices 110_1 that are not adjacent to each other among the plurality of light emitting devices 110 on the growth substrate 10, forming the lens units 240 respectively surrounding each of the first light emitting devices 110_1 over the first package substrate 20, and performing separation for each of first light emitting devices 110_1. Similarly, the light emitting device packages including the respective light emitting devices can be manufactured by mounting the second to fourth light emitting devices 110_2 to 110_4 that are not adjacent to each other onto the second to fourth package substrates 30 to 50, respectively, and performing subsequent processes.

Thus, a gap between light emitting devices can be sufficiently secured, enabling the formation of the lens unit and the individual separation process to be more easily and accurately performed. Also, since the formation of the lens unit and the individual separation process can be performed in a lump by unit of each package substrate, i.e., the subsequent processes can be performed at a wafer level, automation of the formation process can be achieved. Accordingly, a method for manufacturing a light emitting device package according to an embodiment of the disclosure can contribute to the reduction of the percentage of defects and the improvement of productivity, and can reduce the manufacturing cost.

Meanwhile, the subsequent processes such as formation of the lens units after the selective mounting of the first to fourth light emitting devices 110_1 to 110_4 onto the first to fourth package substrates 20 to 50 are described as being sequentially performed for each of first to fourth light emitting devices 110_1 to 110_4, but this is merely for convenience of explanation, and the disclosure is not limited thereto. For example, the subsequent processes may also be simultaneously performed for each of the first to fourth package substrates 20 to 50 after the selective mounting process of the first to fourth light emitting devices 110_1 to 110_4 has been completed.

FIGS. 16A through 16D are plan views illustrating planar shapes of a growth substrate 60 based on the order of the light emitting devices being mounted in a package substrate according to certain other embodiments of the disclosure. For explanation of FIGS. 16A to 16D, since a method of selectively mounting light emitting devices on the growth substrate 60 in the corresponding package substrates with bonding patterns and performing individual packaging through subsequent processes is substantially similar to the method described in FIGS. 1A to 15, a detailed description thereof will be omitted herein, and the following description will be focused on a point that the light emitting devices are grouped and processed in package.

Referring to FIGS. 16A to 16D, first to fourth light emitting device groups 610_1 to 610_4 which are similarly modularized may be repeatedly arranged on the growth substrate to form a matrix shape. Specifically, based on the first light emitting device groups 610_1, the second light emitting device groups 610_2 adjacent thereto in the row direction (X-direction), the third light emitting device groups 610_3 adjacent thereto in the column direction (Y-direction), and the fourth light emitting device groups 610_4 may be repeatedly arranged on the growth substrate 60 to form the matrix shape.

The first to fourth light emitting device groups 610_1 to 610_4 may each include four individual light emitting devices 610 that are adjacent to one other. However, the disclosure is not limited thereto, and the first to fourth light emitting device groups 610_1 to 610_4 may each variably include at least two light emitting devices that are adjacent to each other according to the output characteristics of the light emitting device packages that are required.

The first to fourth light emitting device groups 610_1 to 610_4 may be sequentially mounted in their corresponding package substrates. Thus, since the first to fourth light emitting device groups 610_1 to 610_4 can be mounted in their corresponding package substrates while being spaced apart from one other by at least one light emitting device in the row direction (X-direction), the column direction (Y-direction), and the diagonal direction (D-direction), a gap between units modularized for the subsequent processes can be sufficiently secured.

Thus, the formation of the lens units and the individual separation processes can be more easily and accurately performed even when a high output light emitting device package including a plurality of individual light emitting devices is manufactured. Also, since the formation of the lens units and the individual separation processes can be performed at a wafer level, the automation of the formation process and the improvement of productivity can be achieved.

As shown in FIGS. 16A to 16D, the mounting order is not limited to the mounting order of the first to fourth light emitting device groups 610_1 to 610_4, and the first to fourth light emitting device group 610_1 to 610_4 may be mounted in their corresponding package substrates in different orders.

Figure 17A:
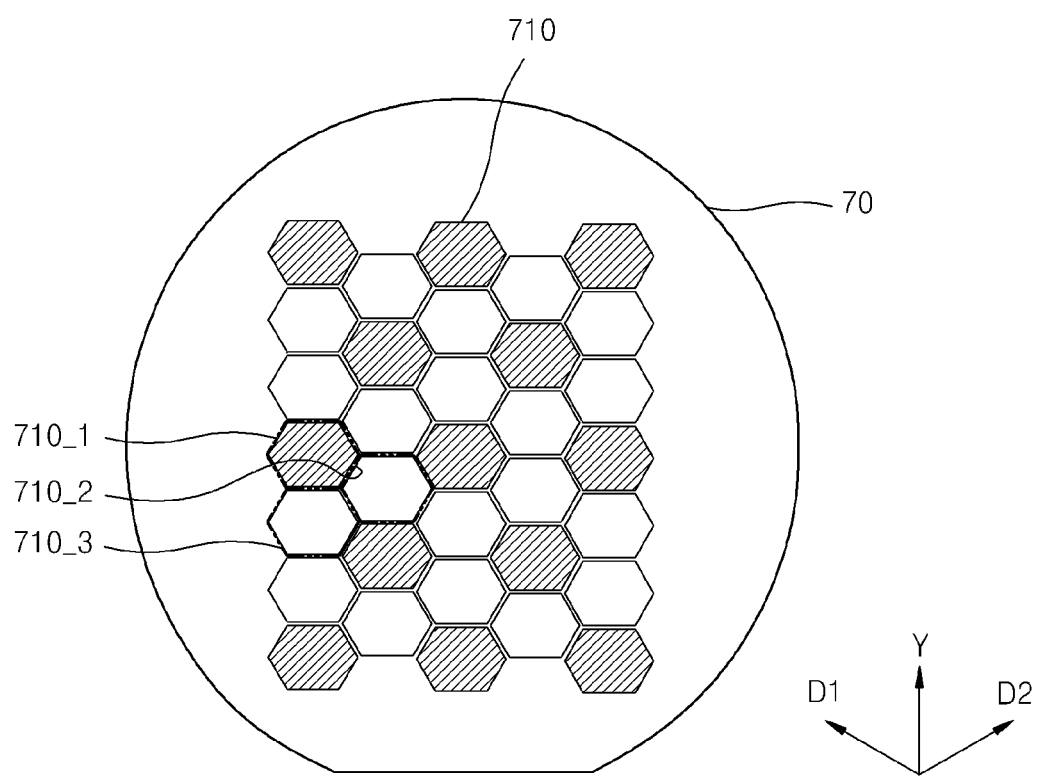
FIGS. 17A through 17C are plan views illustrating planar shapes of a growth substrate based on the order of the light emitting devices being mounted on a package substrate according to certain other embodiments of the disclosure.
Figure 17B:
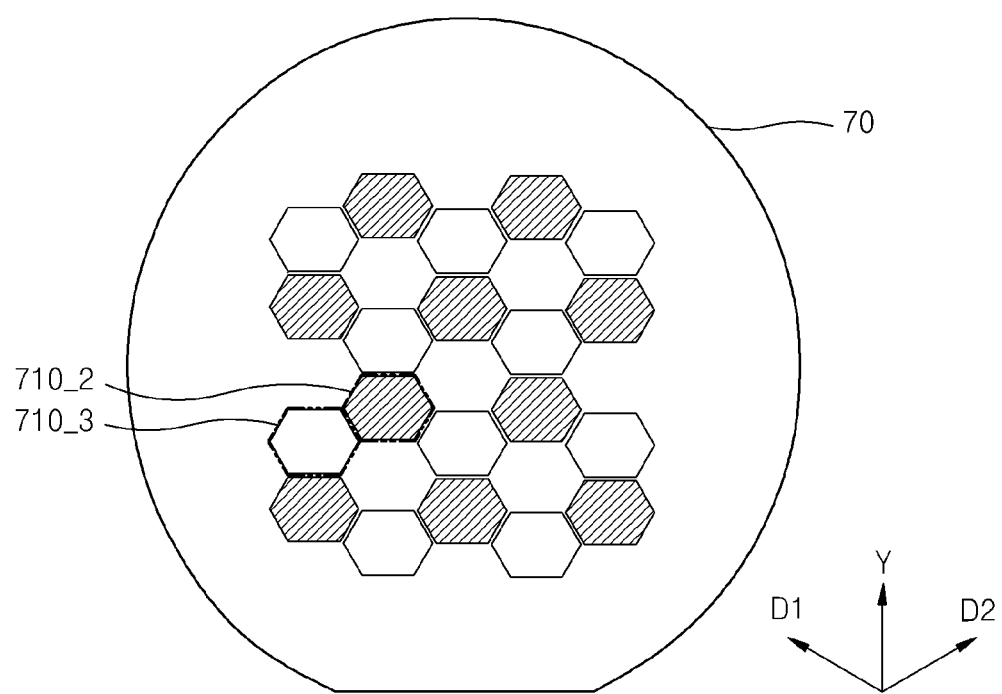
Figure 17C:
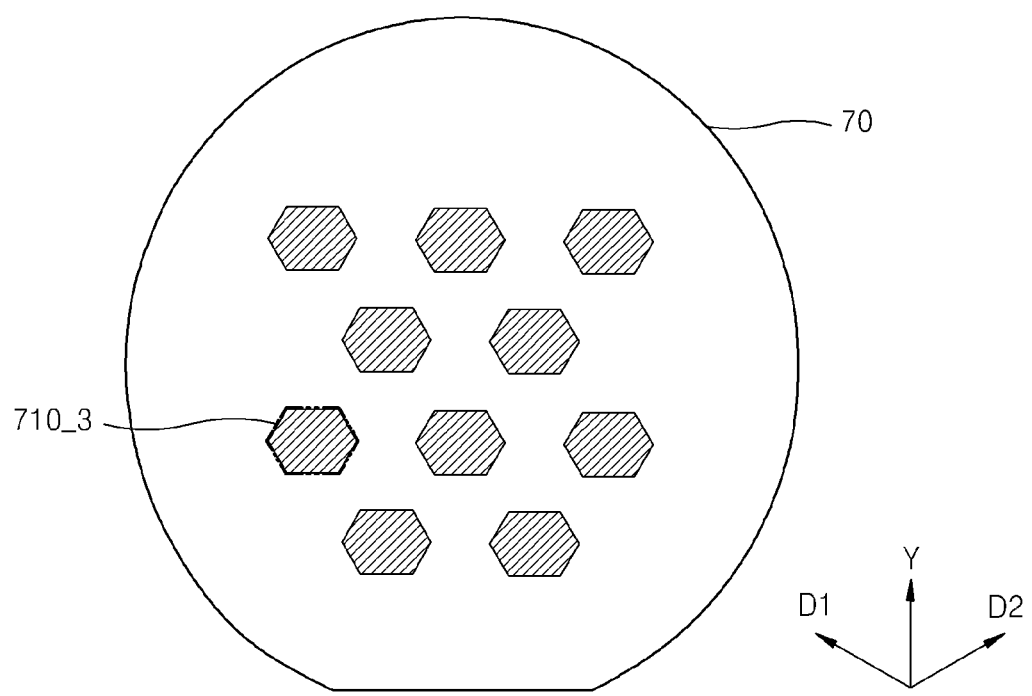

FIGS. 17A through 17C are plan views illustrating planar shapes of a growth substrate 70 based on the order of the light emitting devices being mounted in a package substrate according to certain other embodiments of the disclosure. For explanation of FIGS. 17A to 17c, since a method of selectively mounting light emitting devices on the growth substrate 70 in the corresponding package substrates with bonding patterns and performing individual packaging through subsequent processes is substantially similar to the method described in FIGS. 1A to 15, a detailed description thereof will be omitted herein, and the following description will be focused on a difference between the horizontal sections of the light emitting devices.

Referring to FIGS. 17A to 17C, a plurality of light emitting devices 710 disposed on the growth substrate 70 may have a polygonal shape, e.g., hexagonal shape in horizontal cross-section, but the disclosure is not limited thereto. For example, the plurality of light emitting devices 710 may have various kinds of horizontal cross-section such as a triangle or a pentagon.

The plurality of light emitting devices 710 may be repeatedly arranged over the top surface of the growth substrate 70 in the column direction (Y-direction) and the first or second diagonal directions D1 or D2 to form a honeycomb shape. In the plurality of light emitting devices 710, the first light emitting devices 710_1, the second light emitting devices 710_2 adjacent thereto in a first diagonal direction (D1-direction) or second diagonal direction (D2-direction), and the third light emitting devices 710_3 adjacent thereto in the column direction (Y-direction) may be repeatedly arranged to form the honeycomb shape.

The first to third light emitting devices 710_1 to 710_3 may be sequentially mounted in their corresponding package substrates, respectively. Thus, the first to third light emitting devices 710_1 to 710_3 may be mounted in their corresponding package substrates while being spaced apart from one other by at least one light emitting device in the first and second diagonal directions (D1 and D2-directions) and the column direction (Y-direction), securing a sufficient gap between units modularized for the subsequent processes.

Thus, the formation of the lens units and the individual separation processes can be more easily and accurately performed upon manufacture of the light emitting device package, and can be performed at a wafer level, thereby enabling the automation of the formation process and the improvement of productivity. Also, the manufacturing process can be simplified due to the selective separation of the light emitting devices and the reduction of the number of times mounting steps are performed.

As shown in FIGS. 17A to 17C, the mounting order is not limited to the mounting order of the first to third light emitting devices 710_1 to 710_3, and the first to third light emitting devices 710_1 to 710_3 may be mounted in their corresponding package substrates in different orders. Also, as shown in FIGS. 16A to 16D, the plurality of light emitting devices 710 may also be mounted on and packaged in the package substrates by light emitting device groups each including at least two light emitting devices that are adjacent to each other.

While the disclosure has been particularly shown and described with reference to exemplary embodiments thereof, it will be understood that various changes in form and details may be made therein without departing from the spirit and scope of the following claims.

What is claimed is:

1. A method of manufacturing a light emitting device package, comprising:
preparing a growth substrate comprising a plurality of light emitting devices disposed on a top surface of the growth substrate;
preparing a first package substrate having a plurality of bonding patterns corresponding to some light emitting devices from among the plurality of light emitting devices, the bonding patterns being disposed on a top surface of the first package substrate, and each bonding pattern includes a first conductive region and a second conductive region spaced apart from the first conductive region;
bonding said some light emitting devices from among the plurality of light emitting devices and the bonding patterns by disposing the top surface of the growth substrate to face the top surface of the first package substrate so that each light emitting device overlaps and is in direct contact with the first conductive region and second conductive region of the corresponding bonding pattern;
separating said some light emitting devices from among the plurality of light emitting devices from the growth substrate; and
packaging said some light emitting devices from among the plurality of light emitting devices joined to the bonding patterns.

2. The method of claim 1, wherein said some light emitting devices from among the plurality of light emitting devices are spaced apart from one another by at least one light emitting device.

3. The method of claim 1, wherein said some light emitting devices from among the plurality of light emitting devices is divided into groups comprising at least two light emitting devices that are adjacent to each other, and the groups are spaced apart from one another by at least one group.

4. The method of claim 1, wherein the separating said some light emitting devices from among the plurality of light emitting devices comprises selectively performing a laser lift-off on said some light emitting devices from among the plurality of light emitting devices.

5. The method of claim 1, wherein the packaging of said some light emitting devices from among the plurality of light emitting devices further comprises:
forming, over the first package substrate, lenses surrounding said some light emitting devices from among the plurality of light emitting devices, respectively; and
cutting the first package substrate to form units from said some light emitting devices from among the plurality of light emitting devices, wherein each of the units comprises one of the plurality of light emitting devices and one of the lenses.

6. The method of claim 1, further comprising:

preparing a second package substrate having a plurality of bonding patterns corresponding to other light emitting devices from among the plurality of light emitting devices remaining in the growth substrate, disposed on a top surface of the growth substrate;

bonding said other light emitting devices from among the plurality of light emitting devices remaining in the growth substrate and the bonding patterns of the second package substrate by disposing the top surface of the growth substrate and a top surface of the second package substrate to face each other; and separating said other light emitting devices from among the plurality of light emitting devices bonded to the bonding patterns of the second package substrate from the growth substrate.

7. The method of claim 6, wherein the first package substrate and the second package substrate are separate from each other.

8. The method of claim 1, wherein second conductive region is wider than the first conductive region.

* * * * *